(12) United States Patent
Kim et al.

(10) Patent No.: US 10,599,184 B2
(45) Date of Patent: Mar. 24, 2020

(54) FLEXIBLE DISPLAY APPARATUS AND MANUFACTURING METHOD THEREOF

(71) Applicant: SAMSUNG DISPLAY CO., LTD., Yongin-si, Gyeonggi-do (KR)

(72) Inventors: Sanghoon Kim, Hwaseong-si (KR); Boa Kim, Icheon-si (KR); Hyunjoon Oh, Seongnam-si (KR); Sang-Il Park, Yongin-si (KR); Heonjung Shin, Hwaseong-si (KR); Jeoungsub Lee, Seoul (KR); Min-Hoon Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 571 days.

(21) Appl. No.: 15/181,170

(22) Filed: Jun. 13, 2016

(65) Prior Publication Data
US 2017/0123461 A1 May 4, 2017

(30) Foreign Application Priority Data
Nov. 2, 2015 (KR) .......................... 10-2015-0153354

(51) Int. Cl.
*G06F 1/16* (2006.01)
*G09F 9/30* (2006.01)
(Continued)

(52) U.S. Cl.
CPC .......... *G06F 1/1652* (2013.01); *G06F 1/1641* (2013.01); *G06F 1/1643* (2013.01);
(Continued)

(58) Field of Classification Search
CPC .... G06F 1/1652; G06F 1/1643; G06F 1/1641; H05K 5/0017; H05K 5/0217; H05K 5/03
See application file for complete search history.

(56) References Cited

U.S. PATENT DOCUMENTS

| 2003/0086159 | A1* | 5/2003 | Suzuki | .................... G02B 1/111 |
| | | | | 359/361 |
| 2010/0045618 | A1* | 2/2010 | Huang | .................... G06F 3/041 |
| | | | | 345/173 |

(Continued)

FOREIGN PATENT DOCUMENTS

| KR | 10-2013-0081576 A | 7/2013 |
| KR | 10-2014-0095773 A | 8/2014 |

(Continued)

*Primary Examiner* — Anthony J Frost
(74) *Attorney, Agent, or Firm* — Lewis Roca Rothgerber Christie LLP

(57) ABSTRACT

Provided is a flexible display apparatus defined by a folding area configured to be folded with respect to a folding axis extending in one direction, a non-folding area adjacent the folding area, a display area, and a non-display area adjacent the display area, the display apparatus including a touch screen panel, a window layer on a top surface of the touch screen panel, and including a flat section overlapping the display area, and having a first thickness, and a curvature section extending from the flat section, overlapping the folding area and the non-display area, and having a thickness that gradually decreases away from the flat section, and a cushion layer on a bottom surface of the touch screen panel.

12 Claims, 10 Drawing Sheets

(51) Int. Cl.
*H05K 5/00* (2006.01)
*H05K 5/02* (2006.01)
*H05K 5/03* (2006.01)

(52) U.S. Cl.
CPC ........... *G09F 9/301* (2013.01); *H05K 5/0017* (2013.01); *H05K 5/0217* (2013.01); *H05K 5/03* (2013.01); *G06F 2203/04103* (2013.01); *Y10T 428/10* (2015.01); *Y10T 428/1036* (2015.01)

(56) References Cited

U.S. PATENT DOCUMENTS

| | | | |
|---|---|---|---|
| 2014/0029212 A1* | 1/2014 | Hwang | G09F 9/301 361/749 |
| 2014/0141194 A1* | 5/2014 | Lynam | D06F 39/14 428/81 |
| 2014/0183473 A1* | 7/2014 | Lee | H01L 51/0097 257/40 |
| 2014/0218321 A1* | 8/2014 | Lee | G06F 1/1652 345/173 |
| 2014/0308499 A1 | 10/2014 | Kim et al. | |

FOREIGN PATENT DOCUMENTS

| | | |
|---|---|---|
| KR | 10-2015-0035306 A | 4/2015 |
| KR | 10-2015-0044763 A | 4/2015 |
| KR | 10-2015-0052554 A | 5/2015 |

\* cited by examiner

FLEXIBLE DISPLAY APPARATUS AND MANUFACTURING METHOD THEREOF

CROSS-REFERENCE TO RELATED APPLICATIONS

This U.S. non-provisional patent application claims priority to, and the benefit of, Korean Patent Application No. 10-2015-0153354, filed on Nov. 2, 2015, the entire contents of which are hereby incorporated by reference.

BACKGROUND

1. Field

The present disclosure herein relates to a flexible display apparatus, and a manufacturing method thereof.

2. Description of the Related Art

A variety of display apparatuses have been developed for multimedia devices, such as TVs, mobiles, navigation devices, computer monitors, game devices, and the like. These display apparatuses have recently been developed in various shapes, unlike previously existing flat display apparatuses. A variety of flexible display apparatuses, such as a curved display apparatus, a bending-type display apparatus, a foldable display apparatus, a rollable display apparatus, a stretchable display apparatus, and the like, have also been developed.

SUMMARY

The present disclosure provides a flexible display apparatus with a decreased number of defects.

An embodiment of the inventive concept provides a flexible display apparatus defined by a folding area configured to be folded with respect to a folding axis extending in one direction, a non-folding area adjacent the folding area, a display area, and a non-display area adjacent the display area, the flexible display apparatus including a touch screen panel, a window layer on a top surface of the touch screen panel, and including a flat section overlapping the display area, and having a first thickness, and a curvature section extending from the flat section, overlapping the folding area and the non-display area, and having a thickness that gradually decreases away from the flat section, and a cushion layer on a bottom surface of the touch screen panel.

A rate at which the thickness of the curvature section decreases may gradually decrease away from the flat section.

A rate at which the thickness of the curvature section decreases may gradually increase away from the flat section.

The window layer may include a self-healing material including a urethane resin.

The cushion layer may include a first section overlapping the flat section, and having a second thickness, and a second section extending from the first section, overlapping the curvature section, and having a thickness that gradually decreases away from the first section.

A rate at which the thickness of the second section decreases may gradually decrease away from the first section.

A rate at which the thickness of the second section decreases may gradually increase away from the first section.

The touch screen panel may include a display panel configured to provide an image, and a touch panel on the display panel.

Another embodiment of the inventive concept provides a flexible display apparatus defined by a folding area configured to be folded with respect to a folding axis extending in one direction, a non-folding area adjacent the folding area, a display area, and a non-display area adjacent the display area, the flexible display apparatus including a touch screen panel, a window layer on a top surface of the touch screen panel, a cushion layer on a bottom surface of the touch screen panel, and a protection layer at the folding area, and located on a side surface of the touch screen panel, a side surface of the window layer, and a side surface of the cushion layer wherein the side surfaces of the touch screen panel, the window layer, and the cushion layer cross the folding axis, and overlap a side section of the folding area, and wherein a thickness of the protection layer gradually decreases in a direction away from the side surface of the touch screen panel.

The side surface of the touch screen panel connects the top and bottom surfaces of the touch screen panel to each other, and may be located on substantially the same plane as the side surfaces of the window layer and the cushion layer.

The protection layer may include a self-healing material including a urethane resin.

A cross section of the protection layer may have a semicircular shape.

Another embodiment of the inventive concept provides a method for manufacturing a flexible display apparatus defined by a folding area configured to be folded with respect to a folding axis extending in one direction, a non-folding area adjacent the folding area, a display area, and a non-display area adjacent the display area, the method including providing a touch screen panel, forming a window layer on a top surface of the touch screen panel by coating a first material containing a self-healing material, and forming a cushion layer on a bottom surface of the touch screen panel.

The forming the window layer may include forming a flat section overlapping the display area and having a first thickness, and forming a curvature section overlapping the folding area and the non-display area, and having a thickness that gradually decreases away from the flat section.

The forming the window layer may include applying the first material on the top surface of the touch screen panel while moving a slit for discharging the first material along the top surface of the touch screen panel, and hardening the first material.

The forming the flat section may include discharging the first material while moving the slit at a first speed.

The forming the curvature section may include gradually increasing a moving speed of the slit, and gradually decreasing a rate at which the first material is discharged as the slit moves away from the flat section.

The forming the curvature section may include gradually decreasing a rate at which a speed of the slit increases, and gradually increasing the rate at which the first material is discharged as the slit moves away from the flat section.

The method may further include forming a protection layer by coating the first material on a side surface of the touch screen panel, a side surface of the window layer, and a side surface of the cushion layer, the side surfaces crossing the folding axis, and overlapping one side section of the folding area such that the protection layer is located at least at the folding area.

The forming the protection layer may include applying the first material on the first surfaces of the touch screen panel, the window layer, and the cushion layer, rotating the touch screen panel, the window layer, and the cushion layer such that the surfaces thereof face down, and hardening the first material.

BRIEF DESCRIPTION OF THE FIGURES

The accompanying drawings are included to provide a further understanding of the inventive concept, and are incorporated in, and constitute a part of, this specification. The drawings illustrate exemplary embodiments of the inventive concept and, together with the description, serve to explain principles of the inventive concept. In the drawings.

DETAILED DESCRIPTION

Figure 1A:
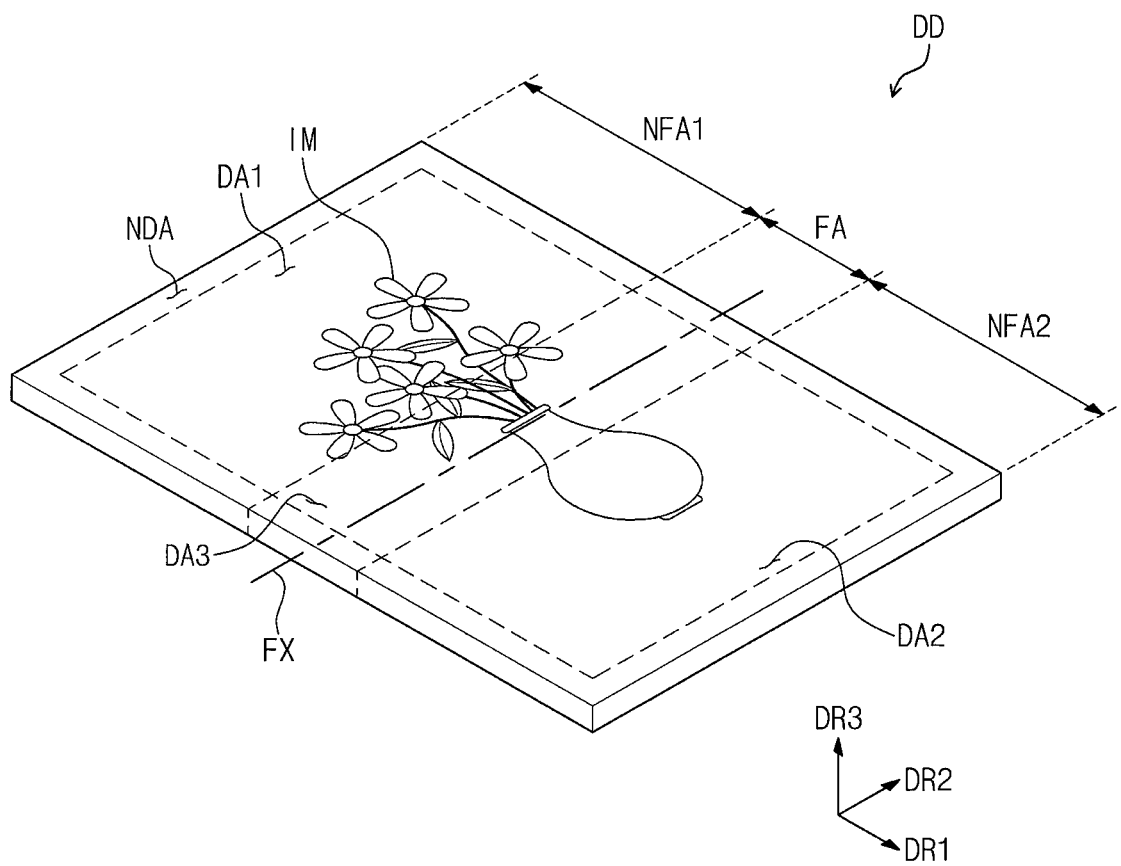
FIGS. 1A and 1B are perspective views illustrating a flexible display apparatus according to an embodiment of the inventive concept.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
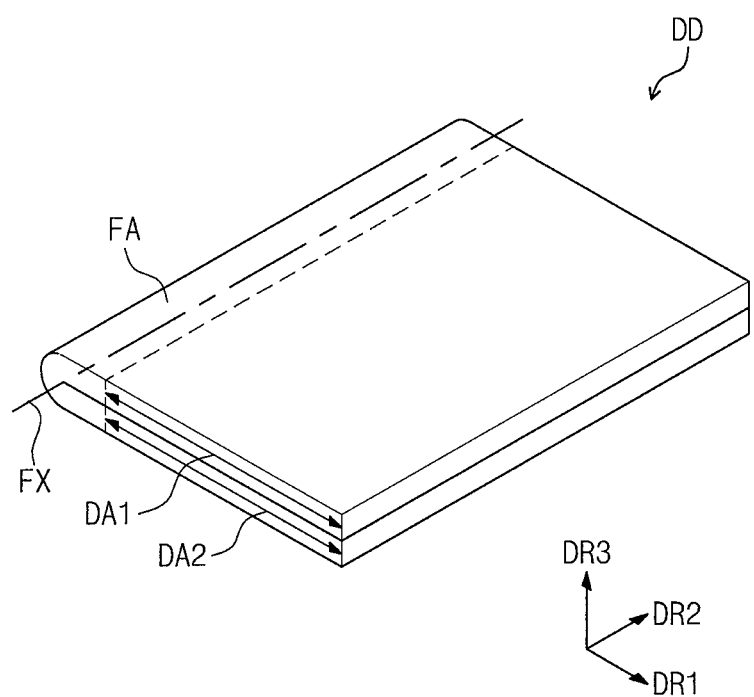

FIGS. 1A and 1B are perspective views illustrating a flexible display apparatus DD according to an embodiment of the inventive concept. In the embodiment, a foldable display apparatus is exemplarily illustrated as an example of the flexible display apparatus DD (hereinafter referred to as display apparatus (DD)), but the inventive concept is not limited thereto but may be applied to various display apparatuses, such as a curved display apparatus, a bending-type display apparatus, a rollable display apparatus, a stretchable display apparatus, and the like. Although not illustrated separately, the display apparatus DD according to this embodiment may be used in large-sized electronic apparatuses such as TVs or outdoor advertisement boards as well as medium and small-sized electronic apparatuses such as mobile phones, personal computers, laptops, personal digital terminals, vehicle navigation units, game machines, wristwatch-type electronic apparatuses, and cameras.

As illustrated in FIGS. 1A and 1B, a display surface of a flexible display apparatus DD, on which an image IM is displayed, is parallel to a surface defined by a first direction DR1 and a second direction DR2 (e.g., parallel to a plane defined by the first direction DR1 and the second direction DR2). A direction that is normal to the display surface is indicated by a third direction DR3. The third direction DR3 indicates a thickness direction of the flexible display apparatus DD. Front and rear surfaces of each member are identified herein with respect to the third direction DR3. However, directions indicated by the directions DR1, DR2, and DR3 are relative concepts, and may be thus changed to other directions.

The display apparatus DD may have, or may define/may be defined by, a folding area FA, which may be folded along a folding axis FX, and first and second non-folding areas NFA1 and NFA2, which are not folded during a folding operation. While the embodiment of the inventive concept shows and describes the display apparatus DD, which may be folded along the folding axis FX extending in the second direction DR2, the inventive concept is not necessarily limited thereto.

As illustrated in FIG. 1A, the display apparatus DD may include a plurality of areas that are identified on a display surface. The display apparatus DD may include first to third display areas DA1, DA2, and DA3 (hereinafter collectively referred to as a display area (DA)), and a non-display area NDA, which may be identified according to whether or not the image IM may be displayed. That is, the display area DA is an area on which an image may be displayed, while the non-display area NDA is an area on which the image is not displayed. In FIG. 1A, an image of a vase is illustrated as an example of the image IM. In an example, the display area DA may have a quadrangular shape. The non-display area NDA may surround the display area DA.

The display apparatus DD may be folded along the folding axis FX such that the first display area DA1 of the first non-folding area NFA1 and the second display area DA2 of the second non-folding area NFA2 face each other. Hereinafter, "inner folding" refers to different display areas being folded so as to face each other. Also, the display apparatus DD may be folded along the folding axis FX such that the first display area DA1 of the first non-folding area NFA1 and the second display area DA2 of the second non-display area NFA2 face away from each other, toward the outside. Hereinafter, "outer folding" refers to different display areas being folded so as to face toward the outside.

Figure 2A:
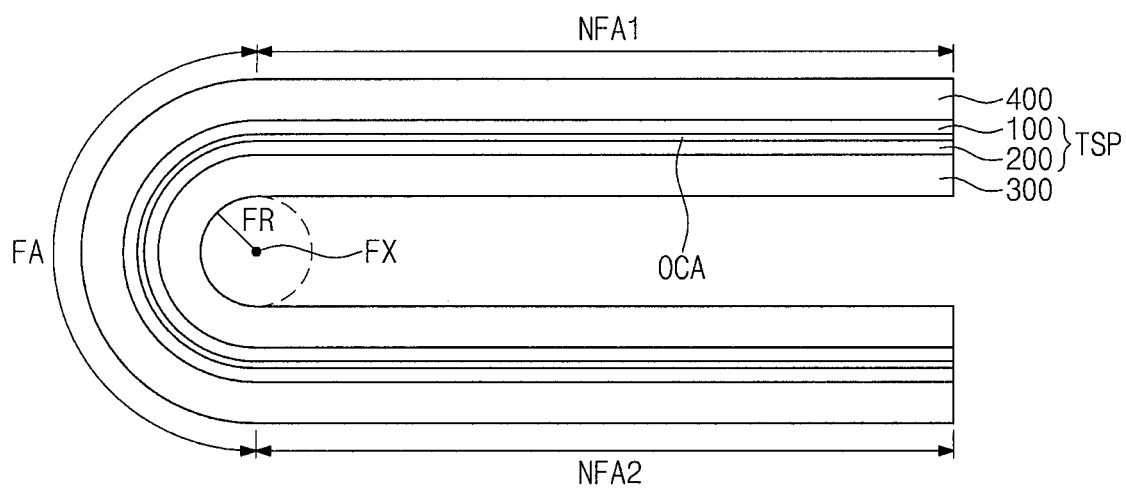
FIGS. 2A and 2B are enlarged cross-sectional views illustrating a flexible display apparatus according to an embodiment of the inventive concept.
Figure 2B:
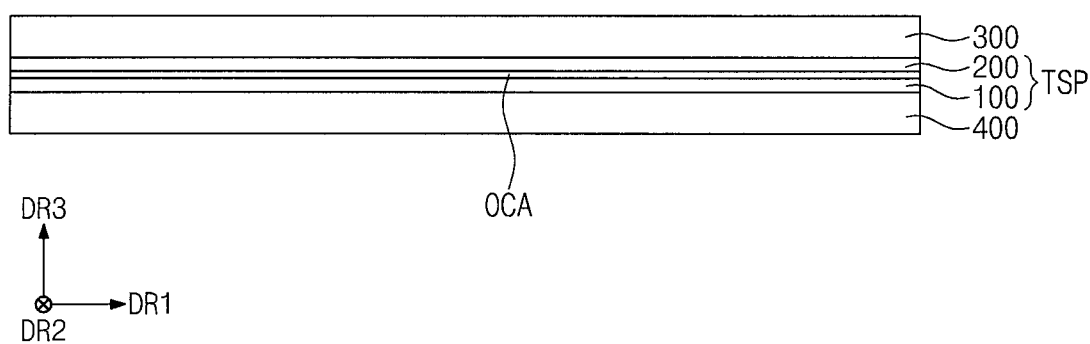

FIGS. 2A and 2B are enlarged cross-sectional views illustrating a display apparatus DD according to an embodiment of the inventive concept.

As illustrated in FIGS. 2A and 2B, the display apparatus DD may be folded along the folding axis FX such that the folding area FA has a curvature radius FR, or the display apparatus DD may be unfolded such that the folding area FA is located on the same plane as the first non-folding area NFA1 and the second non-folding area NFA2.

The display apparatus DD may include a touch screen panel TSP, a window layer 300, and a cushion layer 400. The touch screen panel TSP may include a display panel 100 and a touch panel 200. Each of the display panel 100, the touch panel 200, the window layer 300, and the cushion layer 400 may have flexibility.

The display panel 100 may generate an image IM (see FIG. 1A) corresponding to input image data. The display panel 100 may be a liquid crystal display panel, an organic light emitting display panel, an electrophoretic display panel, an electro wetting display panel, or the like, but is not limited to any of the foregoing panels. In an embodiment of the inventive concept, the display panel 100 is described as an organic light emitting display panel.

The touch panel 200 obtains coordinate information of an input position. The touch panel 200 may be on a front surface of the display panel 100. However, a positional relationship between the display panel 100 and the touch panel 200 is not limited to the description above. The touch panel 200 may be a contact type or a non-contact type touch panel.

The display panel 100 and the touch panel 200 may be coupled to each other by an optically clear adhesive film (OCA), although the inventive concept is not limited thereto. In another embodiment, the OCA film may be omitted. For example, the touch panel 200 may be directly disposed on the display panel 100 by the display panel 100 and the touch panel 200 being manufactured in a continuous process.

The window layer 300 may be located on the touch screen panel TSP. In an embodiment of the inventive concept, the window layer 300 that is located on a top surface of the touch panel 200 is illustrated for explanation. The window layer 300 may protect the touch screen panel TSP by being located on the touch screen panel TSP.

The window layer 300 may comprise a self-healing material including, for example, a urethane resin. The self-healing material may be a transparent composite material having an ability to keep a mechanical property by restoring a bond on the cross section caused by crushing, occurrence of cracks, cutting, or the like. The self-healing material may have elasticity. In an embodiment of the inventive concept, the self-healing material that includes a urethane resin is described as an example, but the particular kind of the self-healing material is not limited thereto.

The cushion layer 400 may be located under the touch screen panel TSP. In an embodiment of the inventive concept, the cushion layer 400 that is located on a bottom surface of the display panel 100 is illustrated for explanation. The cushion layer 400 may protect the touch screen panel TSP by being located under the touch screen panel TSP, such that the cushion layer 400 absorbs a shock that may otherwise be applied to the touch screen panel TSP.

The cushion layer 400 may include a urethane resin, silicon, and/or a self-healing material having elasticity.

Figure 3:
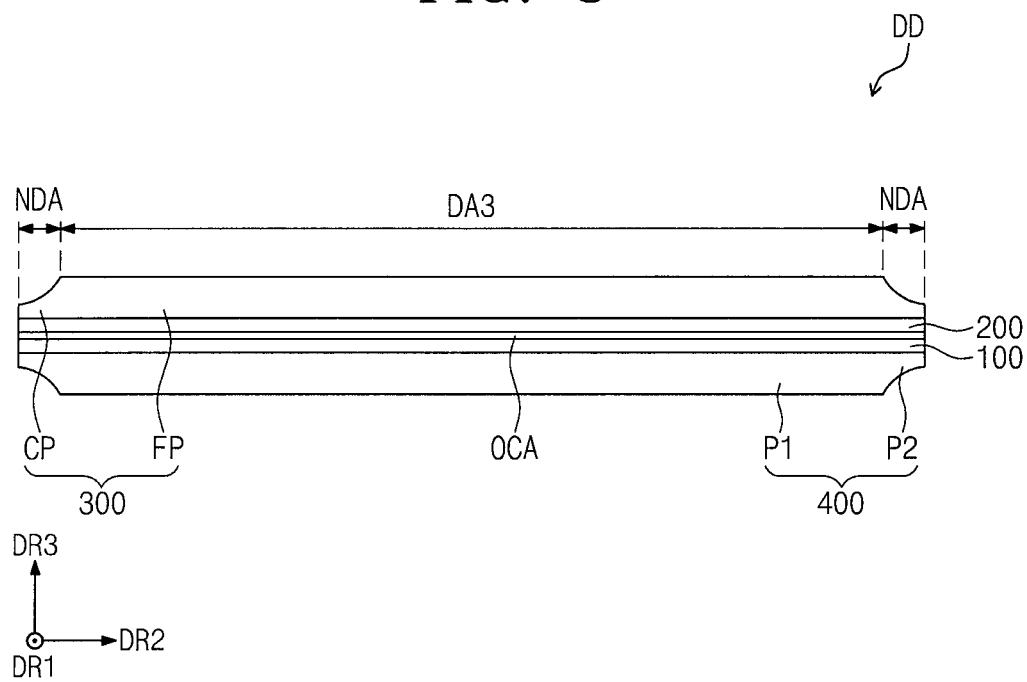
FIG. 3 is a cross-sectional view illustrating a flexible display apparatus according to an embodiment of the inventive concept.

Hereinafter, a detailed description for the window layer 300 and the cushion layer 400 will be made with reference to the drawings. FIG. 3 is a cross-sectional view illustrating a flexible display apparatus according to an embodiment of the inventive concept, and is the cross-sectional view of the display apparatus DD taken along the folding axis FX of FIG. 1A.

Referring to FIGS. 1A, 1B, and 3, the window layer 300 may include a flat section (e.g., flat portion) FP and a curvature section (e.g., curved portion) CP.

The flat section FP overlaps the first to third display areas DA1, DA2, and DA3, and may have a first thickness. The first thickness of the flat section FP may be in a range of about 100 μm to about 1000 μm. When viewed in a plane, the flat section FP may have a quadrangular shape corresponding to the first to third display areas DA1, DA2, and DA3.

The curvature section CP extends from the flat section FP, and may overlap the folding area FA and the non-display area NDA. The curvature section CP is located in the non-display area NDA adjacent the third display area DA3 that overlaps the folding area FA, or may be located in the non-display area NDA adjacent the first to third display areas DA1, DA2, and DA3 overlapping the folding area FA, the first non-folding area NFA1, and the second non-folding area NFA2.

A thickness of the curvature section CP may gradually decrease away from the flat section FP (e.g., a thickness of the curvature section CP may be a function of the proximity of a corresponding portion of the curvature section CP to the flat section FP). In an embodiment of the inventive concept, a rate at which thickness of the curvature section CP decreases may gradually decrease the further it is from the flat section FR The curvature section CP may have a top surface that is concavely curved when compared with the top surface of the flat section FP.

The cushion layer 400 may include a first section P1 and a second section P2. A thickness of the first section P1 may be the same as, or different from, that of the flat section FP. For example, the thickness of the first section P1 may be substantially the same as the thickness of the flat section FP when the cushion layer 400 is made of the same material as the window layer 300.

The first section P1 may overlap the first to third display areas DA1, DA2, and DA3. When viewed in a plane, the first section P1 may have a quadrangular shape corresponding to the first to third display areas DA1, DA2, and DA3.

The second section P2 extends from the first section P1, and may overlap the curvature section CP. The second section P2 may overlap the folding area FA and the non-display area NDA. The second section P2 may be located in the non-display area NDA adjacent the third display area DA3 overlapping the folding area FA, or may be located in the non-display area NDA adjacent the first to third display areas DA1, DA2, and DA3 overlapping the folding area FA, the first non-folding area NFA1, and the second non-folding area NFA2.

A thickness of the second section P2 may gradually decrease as it travels away from the first section P1. In an embodiment of the inventive concept, a rate at which thickness of the second section P2 decreases may gradually decrease as it travels away from the first section P1. The second section P2 may have a top surface that is concavely curved when compared with the top surface of the first section P1.

In an embodiment of the inventive concept, a portion (e.g., the curvature section CP and the second section P2) overlapping the folding area FA of the window layer 300 and the cushion layer 400, and also overlapping the non-display area NDA, may have a smaller thickness than a portion (e.g., the flat section FP and the first section P1) overlapping the first to third display areas DA1, DA2, and DA3. Thus, the display apparatus DD having the smaller thickness in portions overlapping the folding area FA and the non-display area NDA may be provided. During an operation in which the display apparatus DD is repeatedly folded along the folding axis FX, a strain in one end of the display apparatus DD, (e.g., in the portion overlapping the folding area FA) is decreased, and thus, occurrence of cracks in one end of the display apparatus DD may be decreased or prevented.

Also, the window layer 300 and the cushion layer 400 may be prevented from being damaged by including the self-healing material.

Hereinafter, other embodiments of the inventive concept will be described with reference to the drawings. For convenience of explanation, these embodiments will be described, and the description of which will be centered on components that are different from those of the foregoing embodiment, and components that are not described will be appreciated as being the same as those of the foregoing embodiment. Also, the same reference numerals will be given to the same components as those described above, and a duplicate description thereof will be omitted.

Figure 4:
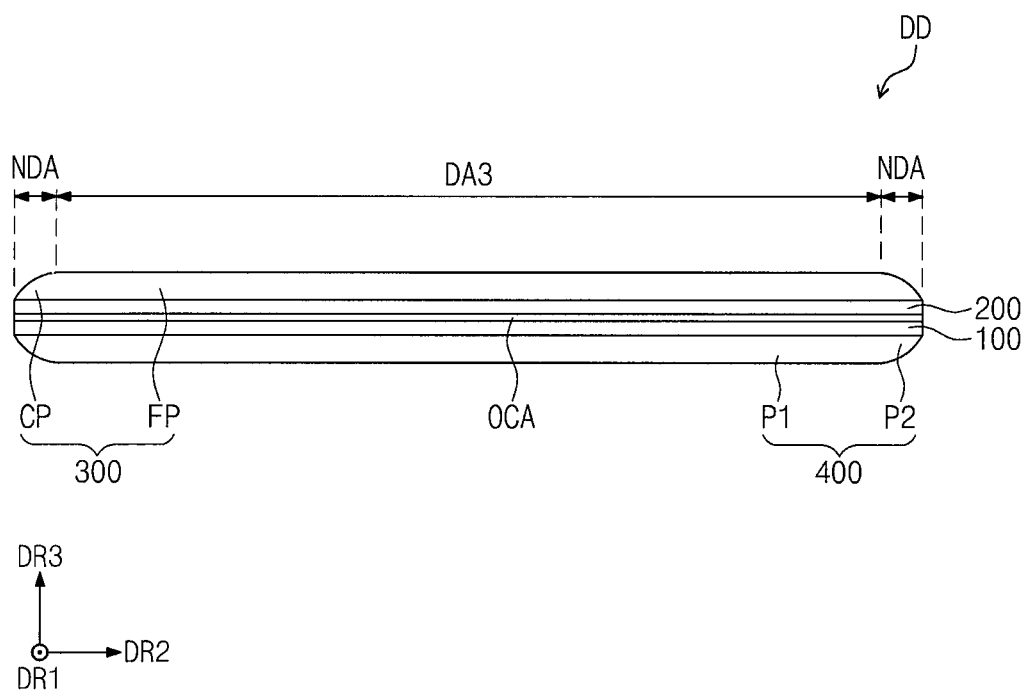
FIGS. 4 and 5 are cross-sectional views illustrating a flexible display apparatus according to another embodiment of the inventive concept.

FIG. 4 is a cross-sectional view of a flexible display apparatus according to another embodiment of the inventive concept, and is the cross-sectional view of the display apparatus DD taken along the folding axis FX of FIG. 1A.

Referring to FIGS. 1A and 4, a window layer 300 may include a flat section FP and a curvature section CP. The flat section FP may have a first thickness, and may overlap the first to third display areas DA1, DA2, and DA3. The curvature section CP extends from the flat section FP, and may overlap the non-display areas NDA. The curvature section CP may be located in the non-display area NDA adjacent the third display area DA3 overlapping the folding area FA, or may be located in the non-display area NDA adjacent the first to third display areas DA1, DA2, and DA3 overlapping the first non-folding area NFA1, the second non-folding area NFA2, and the folding area FA.

A thickness of the curvature section CP may gradually decrease away from the flat section FP. In another embodiment of the inventive concept, a rate at which the thickness of the curvature section CP decreases may gradually increase as it travels away from the flat section FP. A top surface of the curvature section CP may have a convexly curved shape.

A cushion layer 400 may include a first section P1 and a second section P2. The first section P1 overlaps the flat section FP, and may have a second thickness. The thickness of the first section P1 may be the same as or different from that of the flat section FP.

The second section P2 extends from the first section P1, and may overlap the curvature section CP. The second section P2 may overlap the folding area FA and the non-display area NDA. The second section P2 may be limitedly located in the non-display area NDA adjacent the third display area DA3 overlapping the folding area FA, or may be located in the non-display area NDA adjacent the first to third display areas DA1, DA2, and DA3 overlapping the first non-folding area NFA1, the second non-folding area NFA2, and the folding area FA.

A thickness of the second section P2 may gradually decrease as it travels away from the first section P1. In another embodiment of the inventive concept, a thickness decrease rate of the second section P2 may gradually increase as it travels away from the first section P1. A top surface of the second section P2 may have a convexly curved shape.

Figure 5:
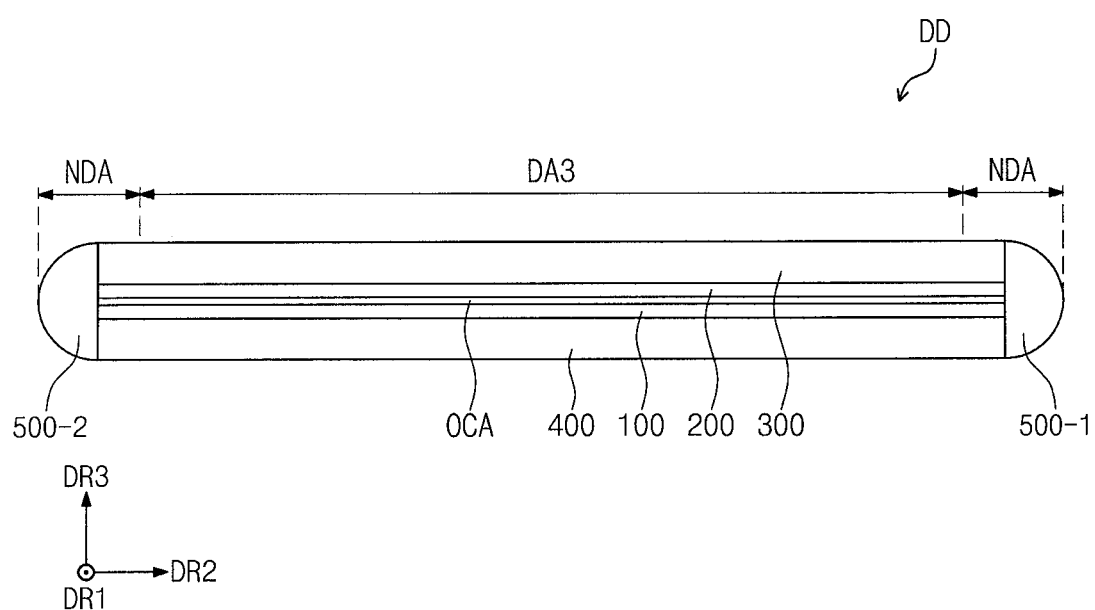

FIG. 5 is a cross-sectional view illustrating a flexible display apparatus according to yet another embodiment of the inventive concept, and is the cross-sectional view of the display apparatus DD taken along the folding axis FX of FIG. 1. Referring to FIGS. 1 and 5, the display apparatus DD according to yet another embodiment includes a display panel 100, a touch panel 200, a window layer 300, a cushion layer 400, and protection layers 500-1 and 500-2. Each of the display panel 100, the touch panel 200, the window layer 300, the cushion layer 400, and the protection layers 500-1 and 500-2 may have flexible properties.

The window layer 300 may be located on a top surface of the touch panel 200. The window layer 300 overlaps a display area DA and non-display areas NDA, and may have a first thickness. The cushion layer 400 may be located on a bottom surface of the display panel 100. The cushion layer 400 overlaps the window layer 300, and may have a second thickness.

The protection layers 500-1 and 500-2 may include a first protection layer 500-1 that is located on one end of the display apparatus DD and that crosses the folding axis FX, and may include a second protection layer 500-2 that is located in the other end of the display apparatus DD crossing the folding axis FX. The first protection layer 500-1 and the second protection layer 500-2 may be at least at the folding area FA. The first protection layer 500-1 and the second protection layer 500-2 may face each other.

The first protection layer 500-1 may be located on one side surface (e.g., a first side surface) of the display panel 100, one side surface (e.g., a first side surface) of the touch panel 200, one side surface (e.g., a first side surface) of the window layer 300, and one side surface (e.g., a first side surface) of the cushion layer 400, and may overlap one side section (e.g., a first side section) of the folding area FA. The one side surface of the display panel 100 connects top and bottom surfaces of the display panel 100 to each other, and may be located on a substantially the same plane as the one side surface of the touch panel 200, the one side surface of the window layer 300, and the one side surface of the cushion layer 400 described above.

A thickness of the first protection layer 500-1 may gradually decrease in a second direction DR2 away from the one side of the display panel 100. A cross section of the first protection layer 500-1 that is orthogonal to the top surface and the one side surface of the display panel 100 (i.e., a cross section that is parallel to a plane formed by the second direction DR2 and the third direction DR3) may have a semicircular shape.

The second protection layer 500-2 may be located on the other side surface (e.g., a second side surface) of the display panel 100, the other side surface (e.g., a second side surface) of the touch panel 200, the other side surface (e.g., a second side surface) of the window layer 300, and the other side surface (e.g., a second side surface) of the cushion layer 400, which overlap the other side surface (e.g., a second side surface) of the folding area FA. The other side surface of the display panel 100 connects the top and bottom surfaces of the display panel 100, and may be located on substantially the same plane as the other side surface of the touch panel 200, the other side surface of the window layer 300, and the other side surface of the cushion layer 400.

A thickness of the second protection layer 500-2 may gradually decrease as it travels away in a direction that is opposite to the second direction DR2, which is perpendicular to the other side of the display panel 100. A cross section of the second protection layer 500-2 that is viewed in a direction that is orthogonal to the top surface of, and the other side surface of, the display panel 100 (i.e., a cross section that is parallel to a plane formed by the second direction DR2 and the third direction DR3) may have a semicircular shape.

The first and second protection layers 500-1 and 500-2 may include a self-healing material including a urethane resin. The self-healing material may have elasticity. In an embodiment of the inventive concept, the self-healing material including a urethane resin is described as an example, but the particular type of material is not limited thereto.

Hereinafter, a method for manufacturing a flexible display apparatus according to an embodiment of the inventive concept will be described with reference to the drawings. For convenience of explanation, the description of the present embodiment will focus on components that are different from those of the foregoing embodiments, and components that are not described will be appreciated as being the same as, or substantially similar to, those of the foregoing embodiments. Also, the same reference numerals will be given to components that are the same as those described above, and duplicated description thereof will be omitted.

Figure 6A:
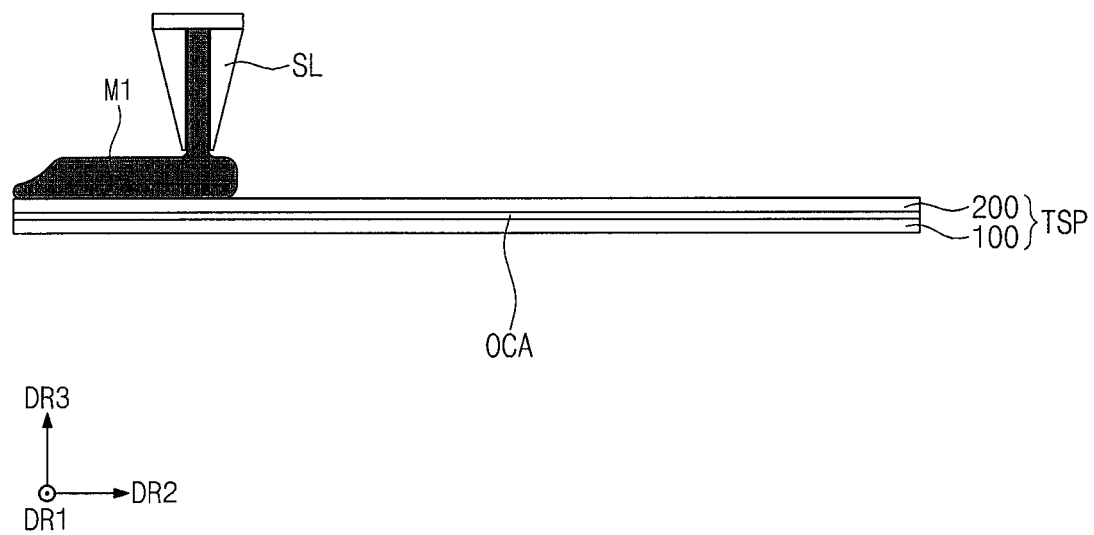
FIGS. 6A and 6B are cross-sectional views illustrating a method for manufacturing a flexible display apparatus according to an embodiment of the inventive concept.
Figure 6B:
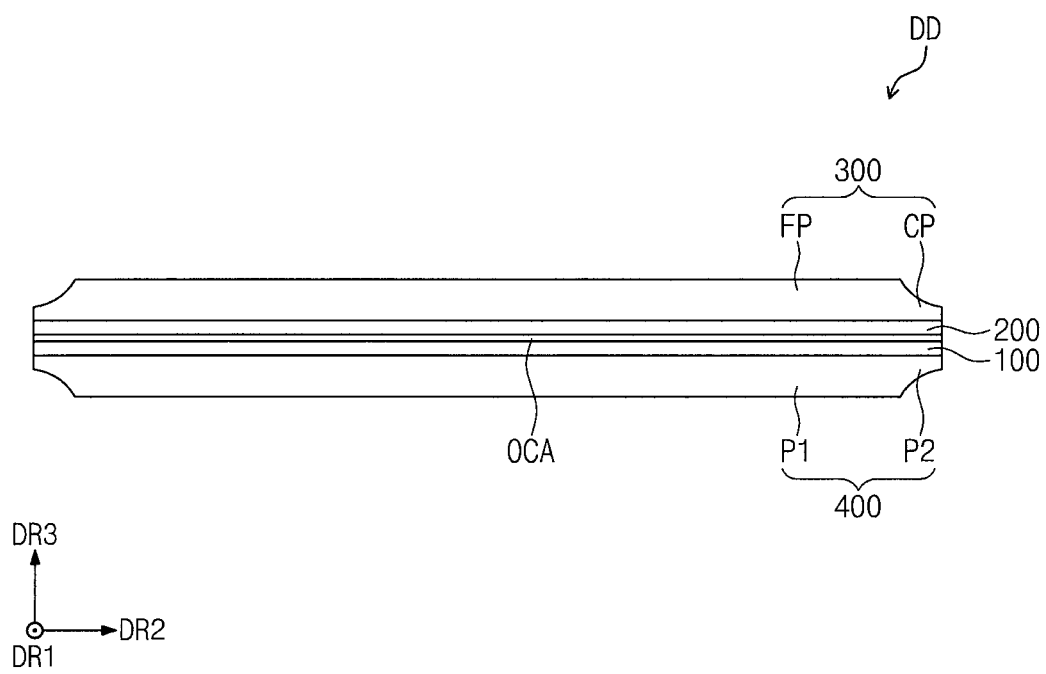

FIGS. 6A and 6B are views illustrating the method for manufacturing the flexible display apparatus according to an embodiment of the inventive concept, and are cross sections taken along the folding axis FX of the flexible display apparatus (hereinafter referred to as display apparatus, DD).

The method for manufacturing the display apparatus DD according to an embodiment of the inventive concept includes: providing a touch screen panel; forming a window layer; and forming a cushion layer.

Referring to FIGS. 6A and 6B, in the providing of the touch screen panel TSP, a display panel 100 and a touch panel 200, which may be coupled with each other by an optically clear adhesive film (OCA), may be provided. The touch screen panel TSP, in which a folding area FA, non-folding areas NFA1 and NFA2 adjacent the folding area FA, a display area DA, and a non-display area NDA adjacent the display area DA are defined, may be provided.

In the forming of the window layer 300, the window layer 300 may be formed by coating a first material including a self-healing material on a top surface of the touch screen panel TSP.

The forming of the window layer 300 may include forming a flat section FP, and forming a curvature section CP. The flat section FP overlaps the display area DA, and may be formed to have a first thickness. The curvature section CP is formed at a portion overlapping the folding area FA and the non-display area NDA, and may be formed to have the thickness that gradually decreases as it travels away from the flat section FP.

The forming the window layer 300 may include applying a first material, and hardening the first material. In the applying of the first material, the first material M1 may be applied on the top surface of the touch screen panel TSP while a slit SL for discharging the first material M1 moves with respect to the touch screen panel TSP. The flat section FP and the curvature section CP may be formed by adjusting a moving speed of the slit SL and/or adjusting a discharging amount of the first material M1. The flat section FP may be formed by applying an amount (e.g., a predetermined amount) of the first material M1 on the top surface of the touch screen panel TSP while the slit SL moves at a first speed. The curvature section CP may be formed by gradually increasing the moving speed of the slit SL, and/or gradually decreasing the discharging amount of the first material M1, as the slit SL travels away from the flat section FP.

The curvature section CP may be formed by gradually decreasing a rate at which the moving speed of the slit SL increases, and/or by increasing a rate at which the discharging amount of the first material M1 decreases, as the slit SL travels away from the flat section FP, or may also be formed by gradually increasing a rate at which the moving speed of the slit SL increases, and/or gradually decreasing a rate at which the discharging amount of the first material M1 decreases.

In the hardening of the first material M1, the first material M1 may be hardened by heat-treatment or the like of the first material M1 applied at the top surface of the touch screen panel TSP.

In the forming of the cushion layer 400, the cushion layer 400 may be formed on a bottom surface of the touch screen panel TSP to overlap the window layer 300. The cushion layer 400 may be formed by coating the first material M1 on the bottom surface of the touch screen panel TSP. A first section P1 and a second section P2 of the cushion layer 400 may be formed by adjusting the moving speed of the slit SL and/or the discharging amount of the first material M1.

Figure 7A:
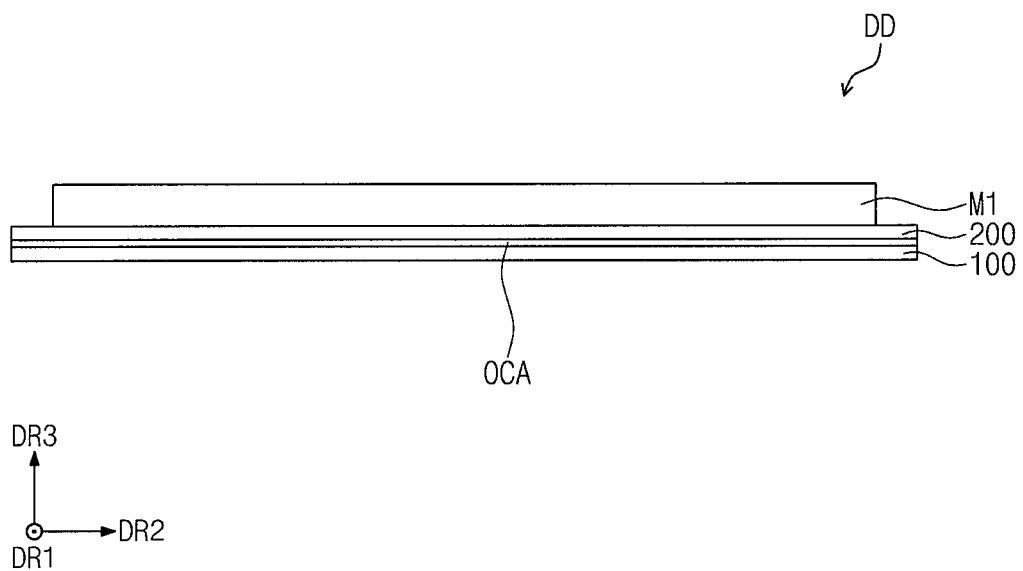
FIGS. 7A and 7B are cross-sectional views illustrating a method for manufacturing a flexible display apparatus according to another embodiment of the inventive concept.
Figure 7B:
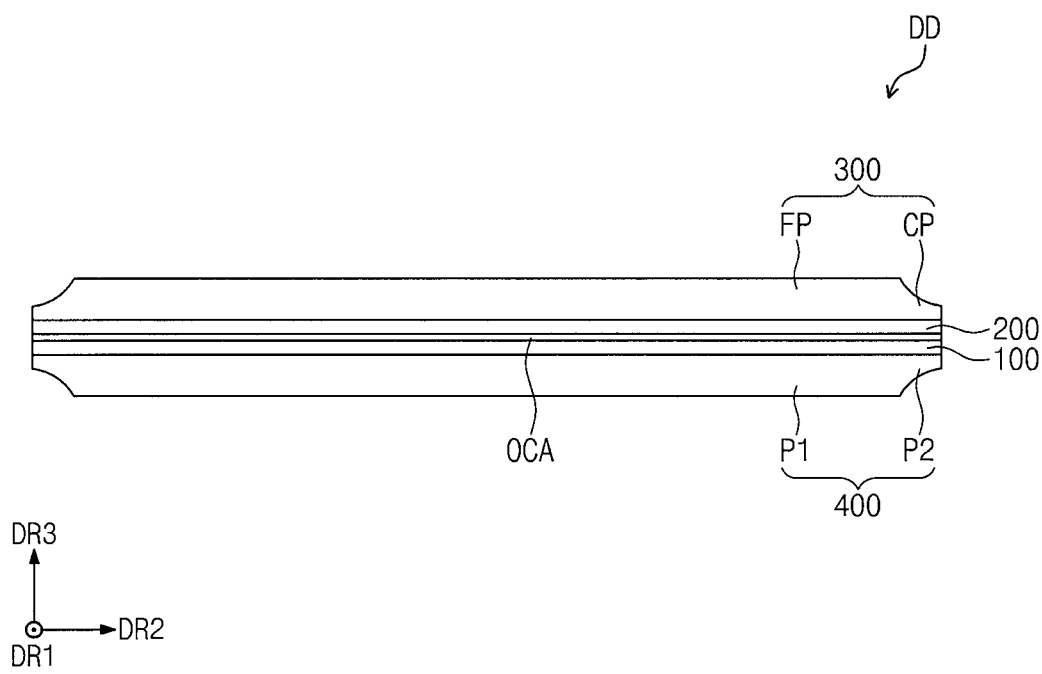
Figure 8A:
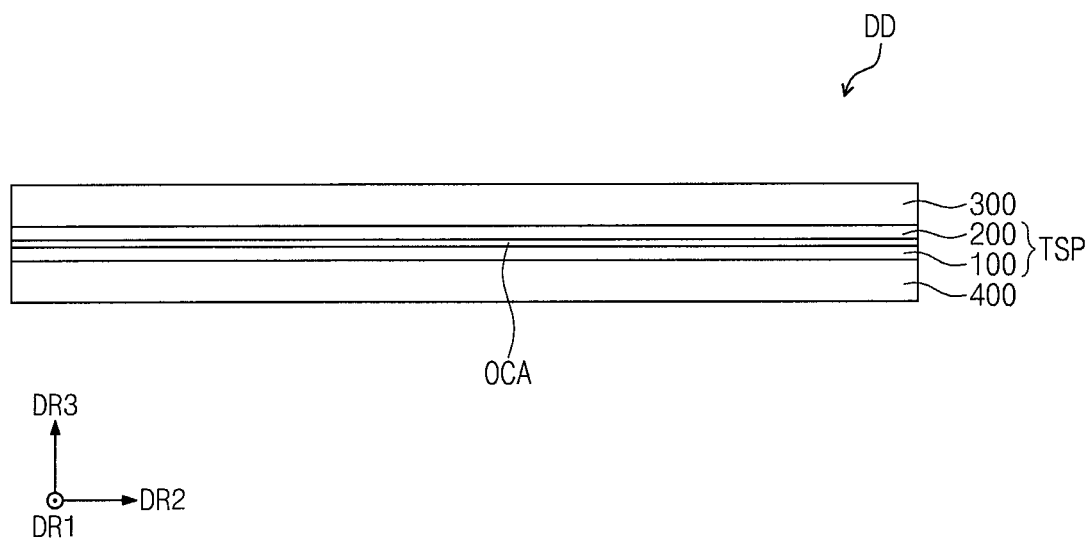
FIGS. 8A, 8B, 8C, and 8D are cross-sectional views illustrating a method for manufacturing, a flexible display apparatus according to yet another embodiment of the inventive concept.
Figure 8B:
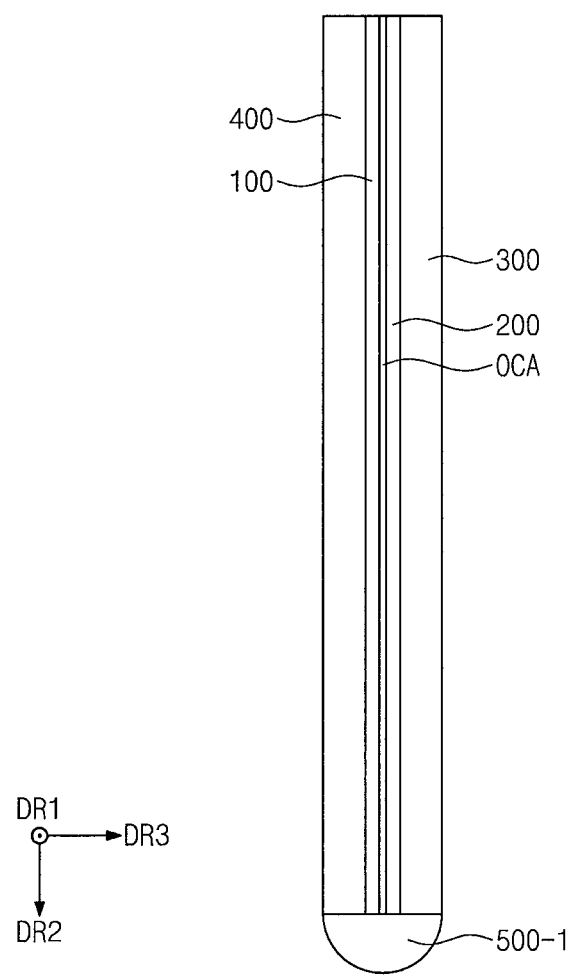
Figure 8C:
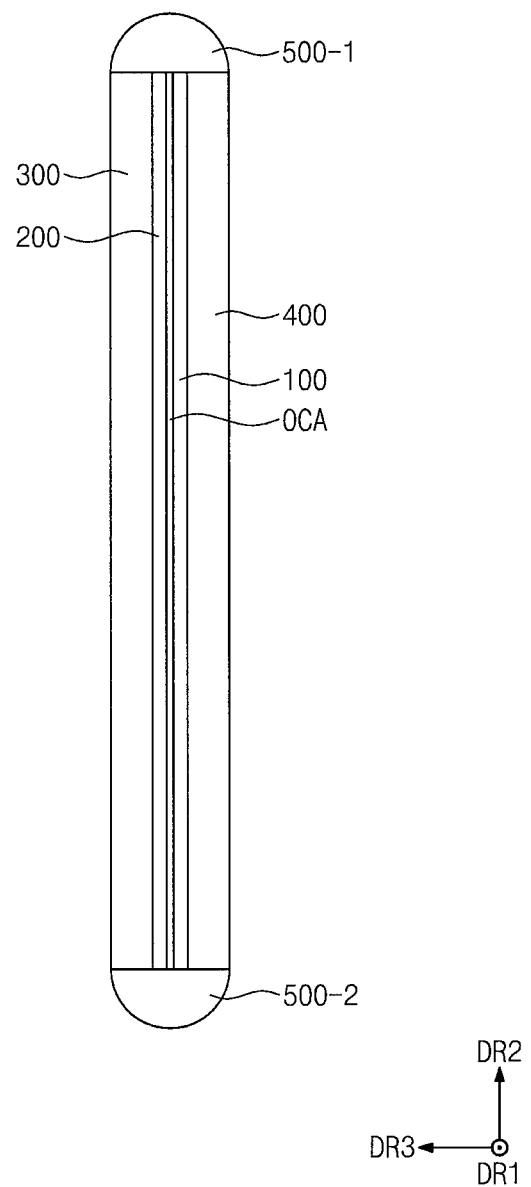
Figure 8D:
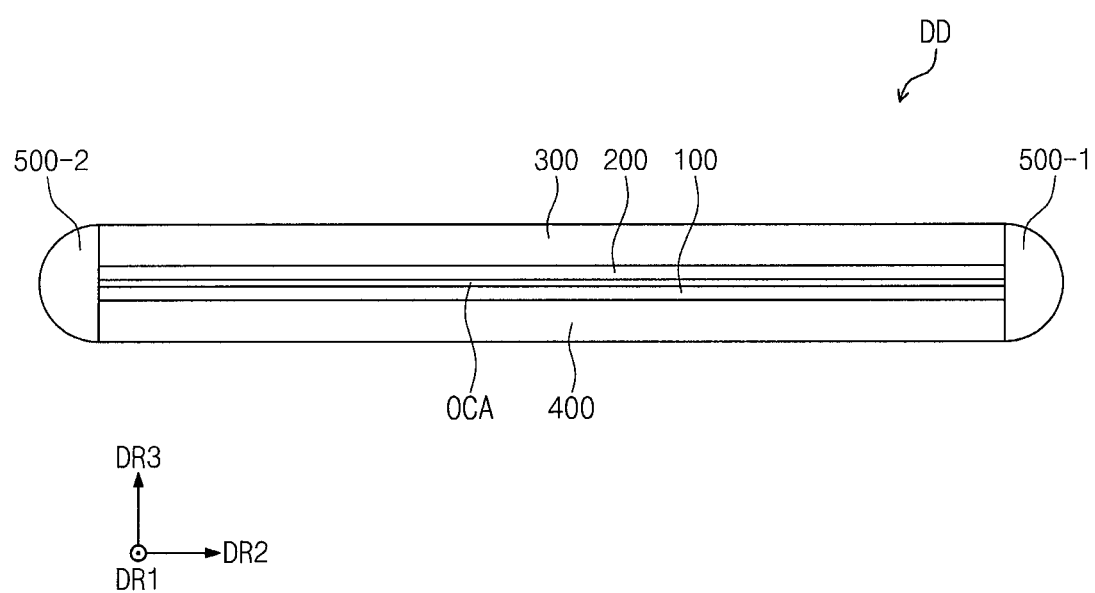

FIGS. 7A and 7B are cross-sectional views illustrating a method for manufacturing a flexible display apparatus according to another embodiment of the inventive concept.

The forming of the window layer 300 may include applying a first material, and hardening the first material.

In the applying of the first material, the first material M1 (e.g., see FIG. 6A) may be applied on a top surface of a touch screen panel TSP while a slit SL for discharging the first material M1 moves. The first material M1 may be applied to have a smaller area (e.g., to initially have a smaller area) than the area of the top surface of the touch screen panel TSP.

In the hardening of the first material, the first material M1 is made to flow due to heat applied thereto such that the first material M1 may cover the entire upper surface of the touch screen panel TSP. The flat section FP and the curvature section CP may be formed according to surface properties, such as a roughness or the like, of the upper surface of the touch screen panel TSP.

FIGS. 8A to 8D are cross-sectional views illustrating a method for manufacturing a flexible display apparatus according to yet another embodiment of the inventive concept.

The method for manufacturing the display apparatus DD according to yet another embodiment of the inventive concept may further include forming a protection layer. The forming of the protection layer may include forming a first protection layer 500-1 and forming a second protection layer 500-2.

In the forming the first protection layer 500-1, the first protection layer 500-1 may be formed by coating a first material (e.g., see FIG. 6A) M1 on one side surface of a touch screen panel TSP, the first material M1 intersecting a folding axis FX and overlapping one side section of a folding area FA, one side surface of a window layer 300, and one side surface of a cushion layer 400, such that the first protection layer 500-1 is located at least at the folding area FA.

The forming of the first protection layer 500-1 may be performed by applying the first material M1 on the one side surface of the touch screen panel TSP, the one side surface of the window layer 300, and the one side surface of the cushion layer 400, and by then hardening the first material M1 while the cushion layer 400, the touch screen panel TSP, and the window layer 300, which are sequentially stacked, are rotated to be in a state such that the one side surface of the touch screen panel TSP, the one side surface of the window layer 300, and the one side surface of the cushion layer 400 face down (e.g., face the ground).

The forming of the second protection layer 500-2 may be performed by applying the first material M1 on the other side surface of the touch screen panel TSP, the other side surface of the window layer 300, and the other side surface of the cushion layer 400, such that the first material M1 is located at least at the folding area FA, and by then hardening the first material M1 when the cushion layer 400, the touch screen panel TSP, and the window layer 300, which are sequentially stacked, are rotated to be in a state such that the other side surface of the touch screen panel TSP, the other side surface of the window layer 300, and the other side surface of the cushion layer 400 face the ground.

As described above, the reliability of a flexible display apparatus may be improved by reducing a strain of one end section of the flexible display apparatus overlapping the folding area.

While this disclosure has been particularly shown and described with reference to preferred embodiments thereof, it will be understood by those skilled in the art that various changes in form and details may be made therein without departing from the spirit and scope of the disclosure as defined by the appended claims. Accordingly, the technical scope of the inventive concept is not limited to the description described in the detailed description of the specification, but shall be determined by the appended claims and their equivalents.

What is claimed is:

1. A flexible display apparatus defined by a folding area configured to be repeatedly folded and unfolded with respect to a folding axis extending in a one direction, a non-folding area adjacent the folding area, a display area having the folding axis pass therethrough, and a non-display area adjacent the display area, the flexible display apparatus comprising:
   a touch screen panel;
   a window layer on a top surface of the touch screen panel, and comprising:
      a flat section overlapping the display area, and having a first thickness; and
      a curvature section extending from the flat section, overlapping the folding area and the non-display area, and having a thickness that gradually decreases in a direction parallel to the one direction away from the flat section; and
   a cushion layer covering a bottom surface of the touch screen panel, and configured to be folded about the folding axis.

2. The flexible display apparatus of claim 1, wherein a rate at which the thickness of the curvature section decreases gradually decreases away from the flat section.

3. The flexible display apparatus of claim 1, wherein a rate at which the thickness of the curvature section decreases gradually increases away from the flat section.

4. The flexible display apparatus of claim 1, wherein the window layer comprises a self-healing material comprising a urethane resin.

5. The flexible display apparatus of claim 1, wherein the cushion layer comprises:
   a first section overlapping the flat section, and having a second thickness; and
   a second section extending from the first section, overlapping the curvature section, and having a thickness that gradually decreases away from the first section.

6. The flexible display apparatus of claim 5, wherein a rate at which the thickness of the second section decreases gradually decreases away from the first section.

7. The flexible display apparatus of claim 5, wherein a rate at which the thickness of the second section decreases gradually increases away from the first section.

8. The flexible display apparatus of claim 1, wherein the touch screen panel comprises:
   a display panel configured to provide an image; and
   a touch panel on the display panel.

9. A flexible display apparatus defined by a folding area configured to be repeatedly folded and unfolded with respect to a folding axis extending in one direction, a non-folding area adjacent the folding area, a display area having the folding axis pass therethrough, and a non-display area adjacent the display area, the flexible display apparatus comprising:
   a touch screen panel;
   a window layer on a top surface of the touch screen panel;
   a cushion layer covering a bottom surface of the touch screen panel, and configured to be folded about the folding axis; and
   a protection layer protruding in a direction parallel to the one direction, and located on:
      a side surface of the touch screen panel;
      a side surface of the window layer; and
      a side surface of the cushion layer
   wherein the side surfaces of the touch screen panel, the window layer, and the cushion layer cross the folding axis, and overlap a side section of the folding area, and
   wherein a thickness of the protection layer gradually decreases in a direction away from the side surface of the touch screen panel.

10. The flexible display apparatus of claim 9, wherein the side surface of the touch screen panel connects the top and bottom surfaces of the touch screen panel to each other, and is located on substantially the same plane as the side surfaces of the window layer and the cushion layer.

11. The flexible display apparatus of claim 9, wherein the protection layer comprises a self-healing material comprising a urethane resin.

12. The flexible display apparatus of claim 9, wherein a cross section of the protection layer has a semicircular shape.

* * * * *